United States Patent
Cheung et al.

(10) Patent No.: US 10,087,068 B2
(45) Date of Patent: Oct. 2, 2018

(54) STRESS RELIEVED MICROFABRICATED CANTILEVER

(75) Inventors: Carl Leung Shin Cheung, London (GB); Bart Wiebren Hoogenboom, St. Albans (GB)

(73) Assignee: UCL Business PLC, London (GB)

( * ) Notice: Subject to any disclaimer, the term of this patent is extended or adjusted under 35 U.S.C. 154(b) by 410 days.

(21) Appl. No.: 14/007,846

(22) PCT Filed: Mar. 28, 2012

(86) PCT No.: PCT/GB2012/050685
§ 371 (c)(1),
(2), (4) Date: Dec. 4, 2013

(87) PCT Pub. No.: WO2012/131360
PCT Pub. Date: Oct. 4, 2012

(65) Prior Publication Data
US 2014/0091674 A1    Apr. 3, 2014

(30) Foreign Application Priority Data

Mar. 28, 2011    (GB) .................................. 1105100.0

(51) Int. Cl.
*B81B 3/00*    (2006.01)

(52) U.S. Cl.
CPC .............. *B81B 3/00* (2013.01); *B81B 3/0072* (2013.01); *B81B 2201/12* (2013.01); *B81B 2203/0118* (2013.01); *B81C 2201/017* (2013.01)

(58) Field of Classification Search
CPC ..... B81B 3/00; B81B 3/0072; B81B 2201/12; B81B 2203/0118
USPC .......................................... 310/300, 301–310
See application file for complete search history.

(56) References Cited

U.S. PATENT DOCUMENTS

| | | | |
|---|---|---|---|
| 2004/0234736 A1* | 11/2004 | Chan ................... | B81C 1/00666 428/209 |
| 2005/0046672 A1* | 3/2005 | Cabal ................... | B41J 2/14427 310/307 |
| 2007/0211986 A1* | 9/2007 | Niwa ..................... | B82Y 20/00 385/13 |
| 2009/0085426 A1* | 4/2009 | Davis .................. | B81C 1/00031 310/306 |

FOREIGN PATENT DOCUMENTS

EP    2458391    5/2012

OTHER PUBLICATIONS

International Search Report & Written Opinion from PCT/GB2012/050685, dated Jan. 10, 2012.

* cited by examiner

*Primary Examiner* — Michael Andrews
(74) *Attorney, Agent, or Firm* — Wolf, Greenfield & Sacks, P.C.

(57) ABSTRACT

A micromechanical device has a functional layer. One or more layers are provided between the functional layer and the micromechanical device to provide stress relief.

13 Claims, 2 Drawing Sheets

US 10,087,068 B2

STRESS RELIEVED MICROFABRICATED CANTILEVER

RELATED APPLICATIONS

This application is a U.S. National Stage application based on International Application No. PCT/GB2012/050685, filed Mar. 28, 2012, which claims priority to United Kingdom Application No. 1105100.0, filed Mar. 28, 2011.

FIELD OF THE INVENTION

This invention relates to micromechanical devices such as microfabricated cantilevers. In particular but not exclusively, it relates to the deposition of metallic films on microfabricated cantilevers for use in scanning probe microscopy and other cantilever sensing and actuation applications

BACKGROUND TO THE INVENTION

Microfabricated cantilevers find application in a range of devices. For example, microfabricated cantilevers for force sensing applications have been designed for applications such as the atomic force microscope, as explained for example in "Atomic Force Microscope", G. Binnig, C. F. Quate and C. Gerber, Physical Review Letters, Vol. 56, No. 9, pp. 930-933 (1986).

For many purposes, micromechanical devices need to be coated by a functional metallic layer which is usually of a different composition than that of the cantilever. For instance, in force sensing applications, it is advantageous to increase the reflectivity of the cantilevers by depositing a thin gold film to improve the sensitivity of optical deflection measurements of a cantilever. In biological sensing applications, microfabricated cantilevers are often coated with a gold thin film to prior to chemical functionalization. In MEMS devices, the cantilevers are often coated with a metal to induce electrostatic actuation. In dynamic mode atomic force microscopy, cantilevers need to be actuated, Several actuation methods, especially but not exclusively those used in liquid, e.g. by laser pulses or by applying an oscillating magnetic field, also require functional coatings to enhance their effectiveness.

The deposition of a metallic thin film layer on micromechanical devices may cause a build-up of interfacial stresses due to mismatch in lattice parameters between the deposited metal and the cantilever material which is usually either silicon nitride or bulk silicon with a native oxide film. Depending on the nature of the functional coating, the compressive or tensile stresses generated by the presence of the metallic thin film may eventually be relieved by the bending of the microfabricated cantilevers. This unwanted bending of the cantilever may limit the usefulness and accuracy of subsequent measurements, and can render the cantilever unfit for purpose. In practice, the degree of bending becomes more prominent for low spring constant (<1 N/m) microfabricated cantilevers and also limits the practical thickness of the functional metallic film layer. Moreover, some functional metallic thin films such as titanium will also oxidise after their deposition on the cantilever, further exacerbating the degree of bending.

Thus, effort has been aimed at minimising the tensile or compressive stresses generated by the inclusion of the functional metallic coating on the microfabricated cantilevers or similar semiconductor based devices. Some measures to produce or maintain a straight cantilever with a functional metallic coating include applying a complex thermal annealing procedure (e.g. U.S. Pat. No. 6,103,305), balancing tensile and compressive stresses by coating the top and bottom sides of the cantilever (U.S. Pat. No. 5,866,805), applying a limited amount of coating only at the tip end of the cantilever (Atomic Force Microscopy of Local Compliance at Solid-Liquid Interfaces", S. J. O'Shea, M. E. Welland and J. B. Pethica, Chemical Physical Letters, Vol. 223, pp. 336-340 (1994), applying low energy ion bombardment to create defects in the metallic coating as in "Relaxation of process induced surface stress in amorphous silicon carbide" by P. Argyrakis, P. McNabb, A. J. Snell, and R. Cheung, Applied Physics Letters, Vol. 89, pp. 034101 (2006) and applying complex processing parameters based on numerical models and in-process characterisation as in "Mitigation of residual film stress deformation in multilayer microelectromechanical systems cantilever devices" by J. S. Pulskamp, A. Wickenden, R. Polcawich, B. Piekarski, and M. Dubey, Journal of Vacuum Science and Technology B, Vol. 21, pp. 2482-2486, (2003). However, none of these methods above can be readily implemented in the fabrication process, resulting in high production costs and/or limitations to the types of functional metallic coatings.

Accordingly, it would be desirable to provide a microfabricated cantilever with a functional metallic coating and method for fabricating the same without unwanted bending of said cantilever.

SUMMARY OF THE INVENTION

This invention provides a micromechanical device having a functional layer, and one or more layers between the functional layer and the micromechanical device to provide stress relief.

Alternatively stated, the invention provides a micromechanical device having a functional layer, and a stress relief interlayer between the functional layer and the micromechanical device. In embodiments, the stress relief interlayer comprises one or to more layers.

Thus, in embodiments, the functional (e.g: metallic) layer is advantageously relieved of interfacial stress and the bending of the device is minimal.

The functional layer may comprise a functional coating. The functional layer may comprise a metallic layer, e.g: a metallic coating layer. The functional layer may comprise a metallic thin film. Examples of such metallic films can be, but are not limited to, iron-oxide, permalloy, cobalt and nickel for magnetic actuation, and titanium and palladium for optical actuation. The functional coating may be a uniform coating.

The functional layer may be an outer layer. Said one or more layers may comprise one or more inner layers.

In some embodiments, the micromechanical device may have a plurality of functional coatings.

In embodiments, the functional coating(s) are provided on top of said one or more layers. A functional coating may be in contact with the outermost of said one or more layers Said one or more layers may include a stress relief layer such as a metallic stress relief layer, which may relieve tensile and/or compressive stresses on the functional metallic coating(s). In embodiments, the stress-relief layer is formed of gold.

In embodiments, the stress relief layer is provided on the micromechanical device. The stress relief layer may be in contact with an outer surface of the micromechanical device.

The functional coating may be provided on the stress relief layer. The functional coating may be in contact with the stress relief layer.

In embodiments said one or more layers comprise a single layer in the form of a stress relief layer.

Alternatively, said one or more layers may include a stress relief layer and an adhesion layer. The adhesion layer may comprise a titanium adhesion layer. The adhesion layer may be provided on the micromechanical device. The adhesion layer may be in contact with an outer surface of the micromechanical device. The stress relief layer may be provided on the adhesion layer. The stress relief layer may be in contact with the adhesion layer.

In embodiments, the adhesion layer serves to attach the stress relief layer to the micromechanical device.

In embodiments, the micromechanical device comprises a semiconductor based device.

The micromechanical device may comprise a cantilever. The cantilever may be a microfabricated cantilever. The cantilever may be a sensing cantilever, e.g a scanning probe microscope force sensing cantilever, or a force sensing cantilever of an atomic force microscope.

In embodiments, the cantilever thickness may be smaller than the cantilever length and width, and may be much smaller than the cantilever length and width.

In some embodiments, the cantilever may have a generally rectangular shape. The cantilever may be formed of silicon.

In embodiments, the cantilever includes a tip. The functional layer may be formed on one side of the cantilever and the tip may be formed on an opposing side.

In embodiments, the combined thickness of the functional layer and said one or more layers is not significantly greater than the thickness of the cantilever.

In embodiments in which said combined thickness is not significantly greater than the thickness of the cantilever, the functional coating can advantageously be deposited without causing the cantilever to bend substantially irrespective of the length and thickness of the cantilever and/or the spring constant of the cantilever This disclosure also provides a method, comprising providing a functional layer to a micromechanical device, wherein one or more layers are provided between the functional layer and the micromechanical device to provide stress relief.

Alternatively stated, the method comprises providing a stress relief interlayer between the functional layer and the micromechanical device. In embodiments, the stress relief interlayer comprises one or more layers.

In embodiments, the functional layer is provided by a deposition process.

The functional layer may be deposited via sputtering, thermal evaporation or another suitable method. Preferably, the functional layer is deposited to provide a suitably uniform coating on the micromechanical device. The thickness of the functional layer may be less than that of the micromechanical device. The functional layer may be least 15 nm thick.

In embodiments, the micromechanical device is advantageously not distorted upon the deposition of the functional layer, which may comprise a functional metallic thin film.

However, the method is applicable in the case of functional layer(s) formed from any suitable material. Moreover, the method is applicable in the case of a micromechanical device formed from any suitable material.

In embodiments, the micromechanical device comprises a scanning probe microscope force sensing cantilever that is coated by a metallic film.

In embodiments, the micromechanical device comprises a force-sensing cantilever of an atomic force microscope. In embodiments, the force-sensing cantilever may be coated with an adequate amount of metallic material without causing bending or permanent distortion of the cantilever. According to embodiments, the metallic coating is advantageously stable during repeated scanning of the cantilever in fluids.

Advantageously, according to embodiments, a functional coating may be deposited on a sensing cantilever without significantly altering the properties of the cantilever.

In embodiments, the micromechanical device comprises an atomic force microscope probe cantilever that can be actuated by a laser source or by applied magnetic fields.

In embodiments, said one or more layers are provided by one or more deposition processes. Said one or more layers may be deposited before the functional layer is deposited.

Advantageously, the method may be readily integrated with current batch cantilever microfabrication processes.

In some embodiments, the method comprises providing a plurality of layers to provide stress relief. Said plurality of layers may include a thin adhesion layer (e.g. titanium or chromium) on the micromechanical device. In some embodiments, a large number of layers are provided including a stress relief layer.

The invention also provides an atomic force microscope comprising a force-sensing cantilever having a functional layer, and one or more layers between the functional layer and the cantilever to provide stress relief.

The invention also provides a scanning probe microscope having a force-sensing cantilever having a functional layer, and one or more layers between the functional layer and the force-sensing cantilever to provide stress relief.

The invention also provides an atomic force microscope comprising a probe cantilever that can be actuated by a laser source or by applied magnetic field, and one or more layers between the functional layer and the cantilever to provide stress relief.

The invention also provides a device comprising: a micromechanical device, a functional layer, and one or more layers between the functional layer and the micromechanical device to provide stress relief.

BRIEF DESCRIPTION OF THE DRAWINGS

So that the invention may be more fully understood, embodiments thereof will now be described, by way of example only, with reference to the accompanying drawings, in which.

The same reference numerals are used to designate the same or similar components throughout the description and drawings. Therefore, repetition of the description of the same or similar components will be omitted.

DETAILED DESCRIPTION

In this specification, a method and apparatus is described for relieving the stress built-up by the deposition of (e.g: metallic) films on micromechanical devices such as cantilevers. In embodiments, the stress relief method comprises providing an interfacial metallic stress relief layer, e.g., with low elastic modulus such as gold, prior to the functional metallic coating layer. The thickness of the stress relief layer can be adjusted to match the degree of stress relief required.

Figure 1:
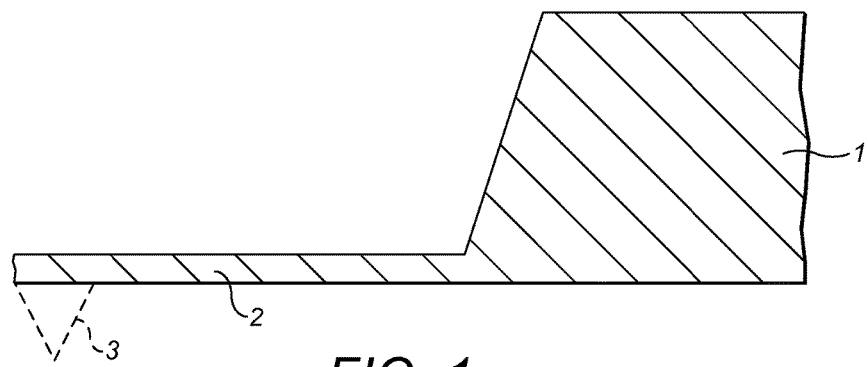
FIG. 1 shows a cross sectional view of a support chip 1 with a microfabricated cantilever 2 which may include a tip 3 at the end for scanning probe force microscopy applications.

Referring to the drawings, FIG. 1 shows a cross sectional view of a supporting chip 1, with a free standing cantilever 2 extending from the supporting chip which is of the same material, exemplified here by a single crystal silicon wafer. The length, width and thickness of cantilever 2 can be defined by conventional semiconductor fabrication processes which also determine the mechanical properties of the cantilever. Parameters for microfabricated cantilevers are the spring constant k and the resonant frequency f as determined by the equations below for rectangular shaped microfabricated cantilevers:

$$k = \frac{wd^3}{4L^3}E \quad -(i)$$

and $$f = 0.56\frac{d}{L^2}\sqrt{\frac{E}{12\rho}} \quad -(ii)$$

Where w is the width of the cantilever, d the thickness of the cantilever, L the length of the cantilever, E the Young's Modulus of the cantilever material, and $\rho$ the density of the cantilever material. As shown, the microfabricated cantilever 2 is fabricated straight.

For many force sensing applications, the spring constant may be lower than 1 N/m for high sensitivity measurements. In addition, cantilevers with high resonance frequencies are preferred for dynamic force atomic force microscopy in liquid environments. As given by the combination of equations (i) and (ii), it is thus desirable to have cantilevers of as small thickness (d) as possible. A sharp tip 3 can also be incorporated at the end of the cantilever 2 for the purpose of force sensing measurements in scanning probe microscopy.

Figure 2A:
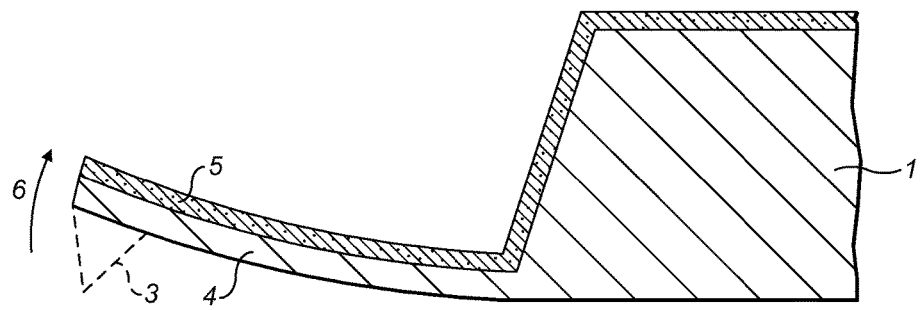
FIG. 2A shows how the application of a metallic coating 5 on the microfabricated cantilever 4 leads to an undesirable bending 6 of the cantilever. The bending can be either way, depending on the properties of the cantilever and the functional layer.

FIG. 2A shows a similar setup as in FIG. 1 with an additional functional metallic coating 5 such as, but not limited to titanium evaporated onto the supporting chip 1 and the cantilever 4. The functional metallic coating can be deposited via sputtering, thermal evaporation or any other method which provides a suitably uniform coating of the functional metallic coating on the support chip 1 and the cantilever 4. The thickness of the functional coating 5 is typically less than that of the cantilever 4 but usually at least 15 nm is required for the bulk-like properties of the coating to be observed.

However, owing to a mismatch between the lattice parameters of titanium and the underlying silicon cantilever 4, the upper surface of the silicon cantilever 4 in contact with the functional metallic coating 5 becomes the subject of tensile stresses. This occurs regardless of the deposition parameters. This results in cantilever 4 bending upwards or downwards to relieve the tensile stresses generated by the presence of the functional metallic coating 5. In addition, the difference in thermal expansion coefficients of the metallic coating and the cantilever can cause the system to act like a bimorph, which can bend due to minute temperature changes.

As a consequence, the microfabricated cantilever 4 may thus be rendered useless due to unwanted bending and is an especially acute problem for small and soft cantilevers. In force sensing applications, the tolerance of the optical detection system to cantilever bending becomes more stringent as the cantilever dimensions shrink. The thickness of the functional metallic coating 5 can be reduced to minimise the bending moment, but will at the same time pose a limiting factor to the effectiveness of the functional metallic coating.

Figure 2B:
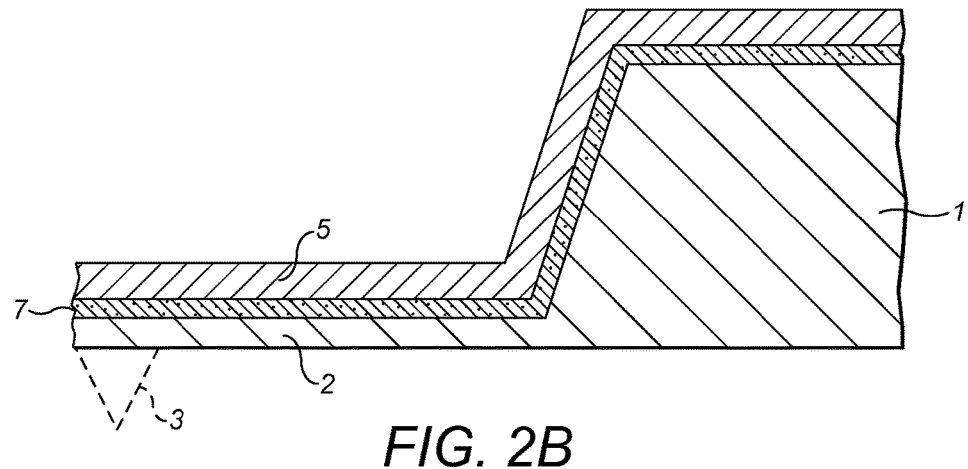
FIG. 2B shows how the undesirable bending of the microfabricated cantilever 2 can be eliminated by including an intermediate stress relief metallic layer 7 between the cantilever and the functional layer 5.

FIG. 2B shows a stress relieved microfabricated cantilever with a functional coating. As shown, a metallic stress relief interlayer 7 is sandwiched between the microfabricated cantilever 2 and the functional metallic coating 5, providing the necessary stress relief such that the cantilever 2 does not bend. Such a stress relief interlayer 7 may comprise a gold film about 15 nm thick on top a cantilever, deposited by electron beam evaporation at a rate not exceeding 3 nm/minute. The low elastic modulus (~80 GPa) of gold coupled with its resistance to chemical attack makes it a suitable candidate as stress relief layer. Moreover, the total thickness of the stress relief interlayer 7 can be adjusted by increasing or decreasing the thickness of the gold film to match the degree of bending due to the functional metallic coating 5. For example, if the functional coating 5 is a 40 nm titanium film (e.g., for high light adsorption for laser actuation), then the gold film in the stress relief interlayer 7 may be thicker than 10 nm for effective stress relief.

Figure 3:
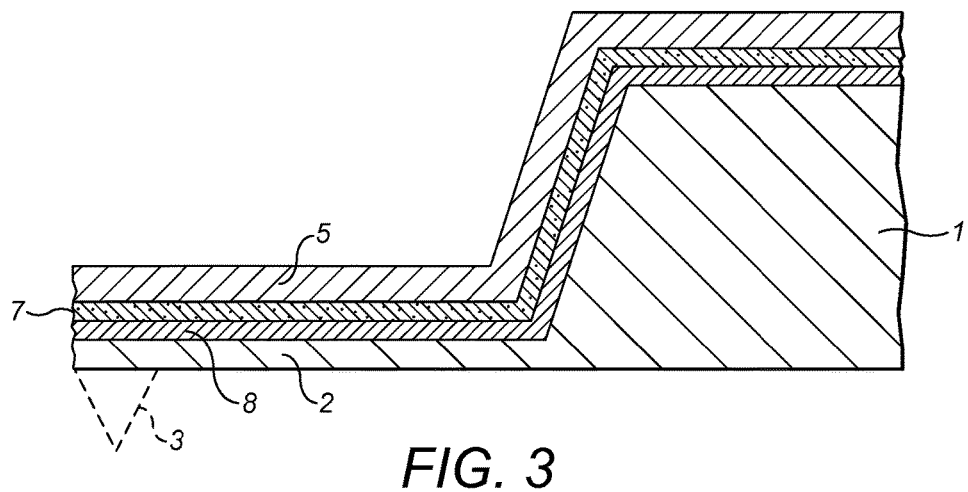
FIG. 3 shows a configuration in which an adhesion layer 8 underlies the stress relief layer 7 and the functional layer 5.

In embodiments, the stress relief interlayer 7 may be formed of multiple layers, such as but not limited to a titanium adhesion layer of about 2 nm thick followed by a gold layer as discussed above. FIG. 3 shows a configuration in which an adhesion layer 8 underlies the stress relief layer 7 and the functional layer 5.

In some embodiments, an additional topping up layer (not shown) may be provided, e.g: to enhance reflectivity.

According to various embodiments of the present invention, a stress relief interlayer for functional coatings on micromechanical devices is disclosed. The stress relief interlayer may comprise a thin adhesion layer on the micromechanical device followed by an interfacial stress relief layer on the said adhesion layer. The method is particularly but not exclusively applicable to microfabricated cantilevers which require functional metallic coating layer(s) that—without stress relief layer—induce undesirable bending of the cantilever.

The microfabricated cantilevers may be employed in applications for a range of devices which include by way of example, atomic force microscopes, microelectromechanical devices (MEMS) or nanoelectromechanical devices (NEMS), high sensitivity accelerometers, sensing of biological molecules, data storage, detection of small vibrations (shockwaves), stress sensors during thin film deposition and small molecule gas sensing.

Many modification and variations will be evident to those skilled in the art, which fall within the scope of the following claims:

1. A micromechanical device having a microfabricated cantilever, a functional layer, and one or more metallic stress relief layers between the functional layer and the micromechanical device microfabricated cantilever, wherein the elastic modulus and thickness of each of the one or more metallic stress relief layers are configured to provide stress relief such that the microfabricated cantilever does not bend, and the thickness of the one or more layers is configured to by matching a degree of bending caused by the functional layer when the one or more metallic stress relief layers are not present.

2. A device according to claim 1, wherein the metallic stress relief layer comprises a gold layer.

3. A device according to claim 1, wherein said one or more layers comprise a stress relief layer and an adhesion layer, wherein the adhesion layer is arranged to attach the stress relief layer to the micromechanical device.

4. A device according to claim 3, wherein the adhesion layer comprises a titanium layer.

5. A device according to claim 1, wherein the functional layer is formed on one side of the cantilever and a tip is formed on the opposing side.

6. A device according to claim 1, wherein the functional layer is an outer layer.

7. A device according to claim 1, wherein said one or more layers are each inner layers.

8. A device according to claim 1, wherein the functional layer is provided on said one or more layers.

9. A method, comprising providing a functional layer to a micromechanical device having a microfabricated cantilever, wherein one or more metallic stress relief layers are provided between the functional layer and the microfabricated cantilever, and wherein the elastic modulus and thickness of each of the one or more metallic stress relief layers are configured to provide stress relief such that the microfabricated cantilever does not bend by matching a degree of bending caused by the functional layer when the one or more metallic stress relief layers are not present.

10. A method as claimed in claim 9, wherein the functional layer is provided to the micromechanical device by way of a deposition method.

11. A method as claimed in claim 9, wherein said one or more layers comprise a stress relief layer deposited by electron beam evaporation.

12. A method as claimed in claim 11, wherein the stress relief layer is deposited at a rate not exceeding 3 nm/minute.

13. A scanning probe microscope comprising a force-sensing microfabricated cantilever, a functional layer, and one or more metallic stress relief layers between the functional layer and the microfabricated cantilever, and wherein the elastic modulus and thickness of each of the one or more metallic stress relief layers are configured to provide stress relief such that the microfabricated cantilever does not bend by matching a degree of bending caused by the functional layer when the one or more metallic stress relief layers are not present.

* * * * *